(12) United States Patent
Feldman et al.

(10) Patent No.: US 8,059,345 B2
(45) Date of Patent: Nov. 15, 2011

(54) INTEGRATED MICRO-OPTICAL SYSTEMS

(75) Inventors: Michael R. Feldman, Charlotte, NC (US); Alan D. Kathman, Charlotte, NC (US); William H. Welch, Charlotte, NC (US)

(73) Assignee: Digitaloptics Corporation East, Charlotte, NC (US)

( * ) Notice: Subject to any disclaimer, the term of this patent is extended or adjusted under 35 U.S.C. 154(b) by 801 days.

(21) Appl. No.: 11/976,260

(22) Filed: Oct. 23, 2007

(65) Prior Publication Data
US 2009/0296228 A1 Dec. 3, 2009

(51) Int. Cl.
*G02B 9/06* (2006.01)
*G02B 9/00* (2006.01)
(52) U.S. Cl. .................................. 359/794; 359/796
(58) Field of Classification Search .................. 359/784, 359/792–794, 796, 797
See application file for complete search history.

(56) References Cited

U.S. PATENT DOCUMENTS

| | | |
|---|---|---|
| 5,004,307 A | 4/1991 | Kino et al. |
| 5,105,408 A | 4/1992 | Lee et al. |
| 5,121,256 A | 6/1992 | Corle et al. |
| 5,125,750 A | 6/1992 | Corle et al. |
| 5,314,596 A | 5/1994 | Shukovsky et al. |
| 5,361,244 A | 11/1994 | Nakamua et al. |
| 5,422,870 A | 6/1995 | Kojima et al. |
| 5,481,386 A | 1/1996 | Shimano et al. |
| 5,508,849 A | 4/1996 | Goodell |
| 5,627,923 A | 5/1997 | Kakizaki |
| 5,696,862 A | 12/1997 | Hauer et al. |
| 5,701,374 A | 12/1997 | Makiuchi |
| 5,715,226 A | 2/1998 | Shimano et al. |
| 5,771,218 A | 6/1998 | Feldman et al. |
| 5,835,257 A | 11/1998 | Itoh et al. |
| 5,911,022 A | 6/1999 | Plickert et al. |
| 5,946,281 A | 8/1999 | Ito et al. |
| 5,999,303 A | 12/1999 | Drake |
| 6,049,430 A | 4/2000 | Heanue et al. |
| 6,061,169 A | 5/2000 | Feldman et al. |
| 6,096,155 A | 8/2000 | Harden et al. |
| 6,188,094 B1 | 2/2001 | Kochi et al. |
| 6,243,350 B1 | 6/2001 | Knight et al. |
| 6,270,696 B1 | 8/2001 | Jain et al. |
| 6,454,470 B1 | 9/2002 | Dwarkin et al. |
| 6,488,417 B2 | 12/2002 | Kropp |
| 6,518,640 B2 | 2/2003 | Suzuki et al. |
| 6,552,858 B2 | 4/2003 | Uno et al. |
| 6,582,630 B2 | 6/2003 | Jain et al. |
| 6,683,298 B1 | 1/2004 | Hunter et al. |
| 6,722,793 B2 | 4/2004 | Althaus et al. |
| 6,724,694 B2 | 4/2004 | Knight et al. |
| 6,825,995 B2 * | 11/2004 | Yamada et al. ............... 359/796 |
| 7,202,460 B2 | 4/2007 | Onodera et al. |

(Continued)

FOREIGN PATENT DOCUMENTS

EP  0 465 676  1/1992

(Continued)

*Primary Examiner* — William Choi
(74) *Attorney, Agent, or Firm* — Lee & Morse, P.C.

(57) ABSTRACT

An integrated micro-optical system includes at least two wafers with at least two optical elements provided on respective surfaces of the at least two wafers, at least one of the two optical elements being a spherical lens. The resulting optical system presents a high numerical aperture. One of the optical elements may be a refractive element formed in a material having a high index of refraction.

34 Claims, 11 Drawing Sheets

U.S. PATENT DOCUMENTS

| | | |
|---|---|---|
| 2005/0274968 A1 | 12/2005 | Kuo et al. |
| 2006/0157642 A1 | 7/2006 | Nagano |
| 2007/0166029 A1 | 7/2007 | Lee et al. |
| 2008/0055748 A1 | 3/2008 | Konno |
| 2008/0213689 A1 | 9/2008 | Kocsis et al. |
| 2008/0224721 A1 | 9/2008 | Kim et al. |

FOREIGN PATENT DOCUMENTS

| | | |
|---|---|---|
| EP | 0 814 468 | 12/1997 |
| GB | 2 279 171 A | 12/1994 |
| JP | 63-237491 A | 10/1988 |
| JP | 02-018720 A | 1/1990 |
| JP | 05-250708 A | 9/1993 |
| JP | 05-290402 A | 11/1993 |
| JP | 06-251410 A | 9/1994 |
| JP | 07013161 A * | 1/1995 |
| JP | 08-248641 A | 9/1996 |
| JP | 09-035318 A | 2/1997 |
| JP | 09-161310 A | 6/1997 |
| JP | 2003-524849 T | 8/2003 |
| WO | WO 96/027880 A1 | 9/1996 |

* cited by examiner

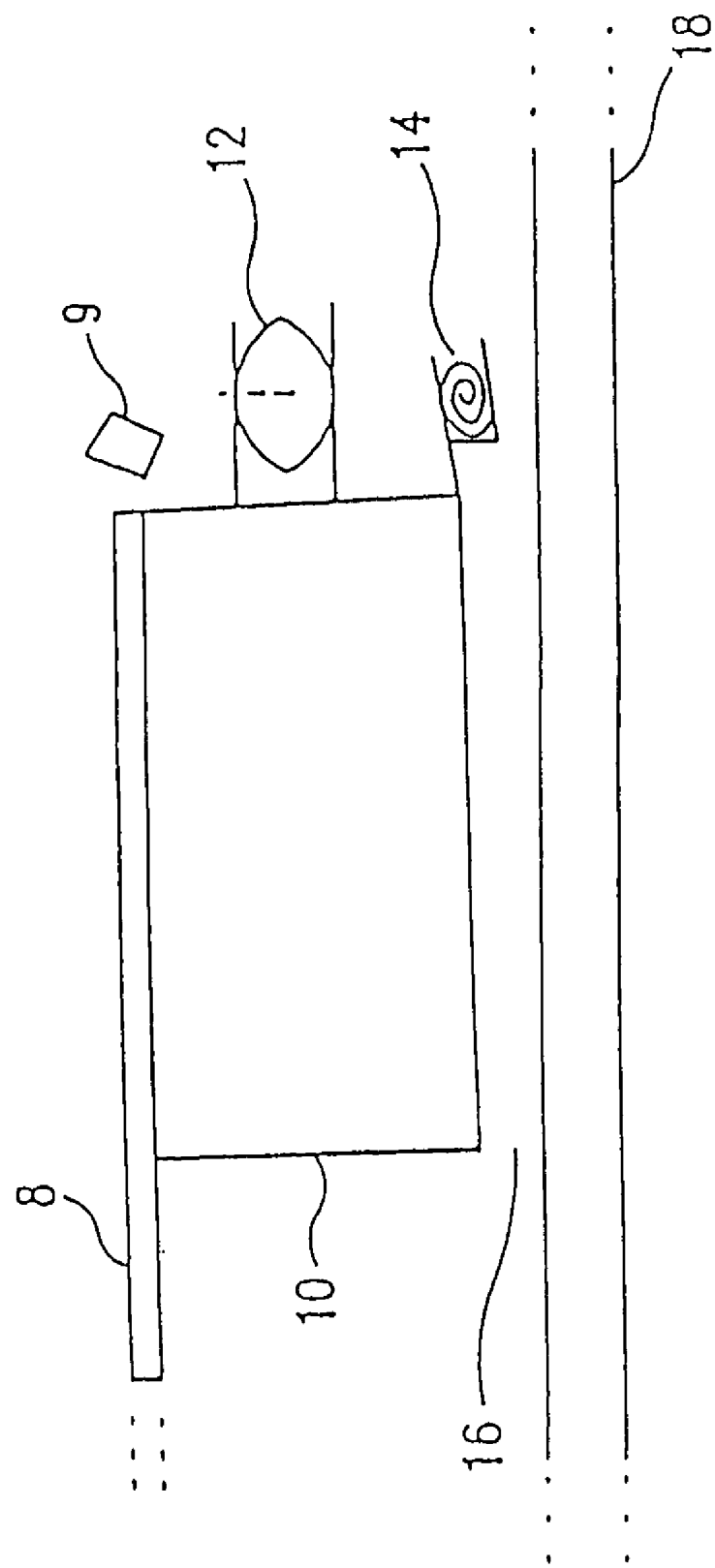

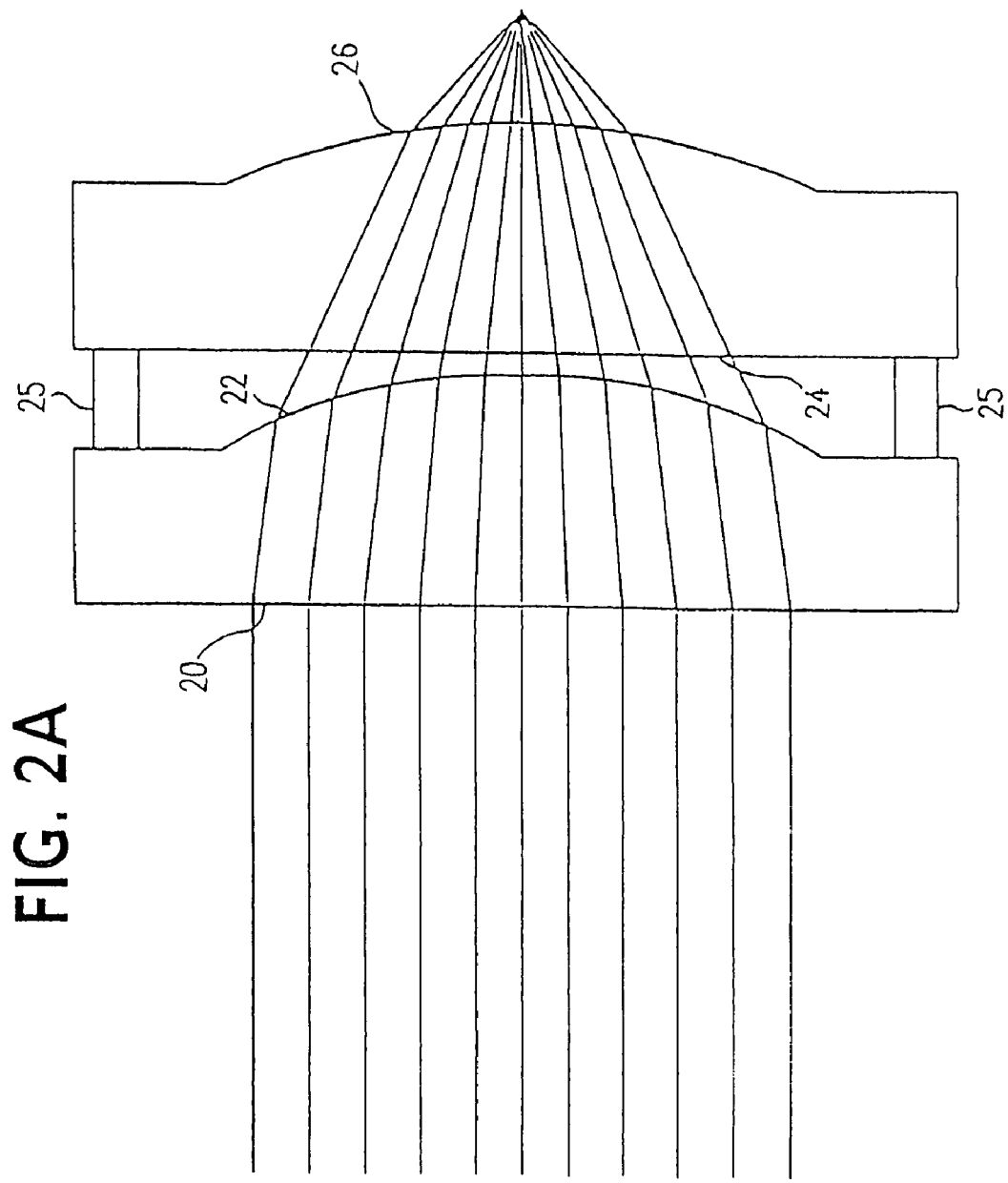

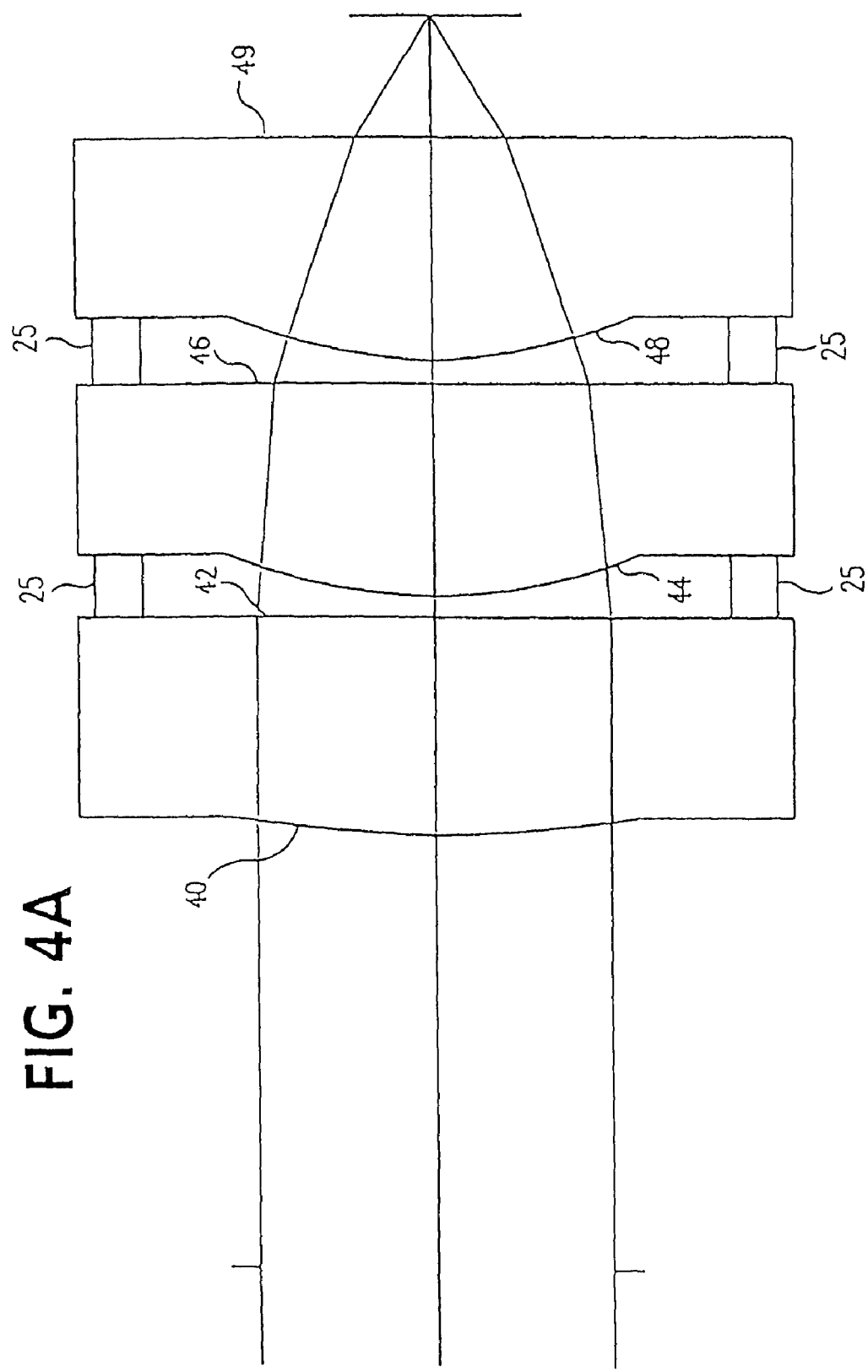

INTEGRATED MICRO-OPTICAL SYSTEMS

CROSS-REFERENCES TO RELATED APPLICATIONS

The present application claims priority under 35 U.S.C. §120 to co-pending U.S. patent application Ser. No. 10/298,048, filed Nov. 18, 2002, which in turn claims priority to U.S. patent application Ser. No. 10/206,095, filed Jul. 29, 2002, issued as U.S. Pat. No. 6,542,281 on Apr. 1, 2003, which claims priority to U.S. patent application Ser. No. 09/722,710, filed Nov. 28, 2000, issued as U.S. Pat. No. 6,426,829 on Jul. 30, 2002, which claims priority to U.S. patent application Ser. No. 09/566,818, filed May 8, 2000, issued as U.S. Pat. No. 6,295,156 on Sep. 25, 2001, which claims priority from U.S. application Ser. No. 09/276,805, filed on Mar. 26, 1999, issued as U.S. Pat. No. 6,061,169 on May 9, 2000, which claims priority under 35 U.S.C. §119 to U.S. Provisional Application No. 60/079,378 filed on Mar. 26, 1998, the entire contents of all of which are hereby incorporated by reference in their entirety for all purposes.

BACKGROUND OF THE INVENTION

1. Field of the Invention

The present invention is directed to integrating optics on the wafer level, particularly for realizing a high numerical aperture system.

2. Description of the Related Art

Magneto-optical heads are used to read current high-density magneto-optic media. In particular, a magnetic coil is used to apply a magnetic field to the media and light is then also delivered to the media to write to the media. The light is also used to read from the media in accordance with the altered characteristics of the media from the application of the magnetic field and light.

An example of such a configuration is shown in FIG. 1. In FIG. 1, an optical fiber 8 delivers light to the head. The head includes a slider block 10 which has an objective lens 12 mounted on a side thereof. A mirror 9, also mounted on the side of the slider block 10, directs light from the optical fiber 8 onto the objective lens 12. A magnetic coil 14, aligned with the lens 12, is also mounted on the side of the slider block 10. The head sits on top of an air bearing sandwich 16 which is between the head and the media 18. The slider block 10 allows the head to slide across the media 18 and read from or write to the media 18.

The height of the slider block 10 is limited, typically to between 500-1500 microns, and is desirably as small as possible. Therefore, the number of lenses which could be mounted on the slider block is also limited. Additionally, alignment of more than one lens on the slider block is difficult. Further, due to the small spot required, the optics or overall optical system of the head need to have a high numerical aperture, preferably greater than 0.6. This is difficult to achieve in a single objective lens due to the large sag associated therewith. The overall head is thus difficult to assemble and not readily suited to mass production.

SUMMARY OF THE INVENTION

Therefore, it is an object of the present invention to provide an integrated optical system that substantially overcomes one or more of the problems due to the limitations and disadvantages of the related art.

It is another object of the present invention to integrating optics on the wafer level to create a high numerical aperture system.

The above and other objects of the present invention may be realized by providing an integrated micro-optical apparatus including a die formed from more than one wafer bonded together, each wafer having a top surface and a bottom surface, bonded wafers being diced to yield multiple die, at least two optical elements being formed on respective surfaces of each die, at least one of said at least two optical elements being a spherical lens, a resulting optical system of each die having a high numerical aperture.

The die may further include a compensating element which compensates for aberrations exhibited by the spherical lens. The compensating element may be on a surface immediately adjacent the spherical lens. The compensating element may be a diffractive element or an aspheric lens. The die may include at least one additional refractive element, all refractive elements of the die being formed in material having a high numerical aperture. The refractive element may be on a bottom wafer and of a material having a higher refractive index than that of the bottom wafer. The spherical lens may be made of a material having a higher index of refraction than a wafer on which it is formed, e.g., photoresist.

The die may include an aperture holding the spherical lens. The spherical lens in the aperture may be a ball lens. The ball lens may have a round spherical surface and a non-spherical surface. The non-spherical surface may be flat.

The bottom surface of the bottom wafer of the more than one wafer bonded together may include a layer of material deposited thereon. The layer of material may be deposited in accordance with a difference between a desired thickness and a measured thickness of the die. The layer may have a different refractive index than said bottom wafer. The spacing between wafers may be varied in accordance with a difference between a desired thickness of a wafer and a measured thickness of the wafer. The spacing may be varied in accordance with a difference between a desired thickness and a measured thickness of the die.

The above and other objects of the present invention may be realized by providing a method for forming an integrated micro-optical apparatus including bonding a first wafer and a second wafer together, each wafer having a top surface and a bottom surface; etching a plurality of holes in the first wafer, placing a round spherical lens in each of the holes of the first wafer, dicing bonded first and second wafers to yield multiple dies, and, before dicing, forming at least one optical element on one of the top surface and the bottom surface of the second wafer.

The method may further include modifying a surface of the round spherical lens to form a non-spherical surface. The non-spherical surface may be flat. The modifying may include polishing. The placing may include providing bonding material between said round spherical lens and the first wafer. The providing may include coating the round spherical lens in the hole with a wettable metal and then coating the round spherical lens in the hole with solder. The etching may include etching the first wafer from both the first and second surface of the first wafer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein:

FIG. 1 illustrates a configuration of a high-density flying head magneto-optical read/write device;

FIG. 2A illustrates one configuration for the optics to be used in forming a slider block;

FIG. 4A illustrates a third embodiment of an optical system to be used in the slider block of the present invention;

DETAILED DESCRIPTION OF THE PREFERRED EMBODIMENTS

All of the optical systems shown in FIGS. 2A-4B provide satisfactory results, i.e., a high numerical aperture with good optical performance. The key element in these optical systems is the distribution of the optical power over multiple available surfaces. This distribution may be even over the multiple surfaces. Sufficient distribution for the high numerical aperture (NA) required is realized over more than one surface. Due to the high numerical aperture required, this distribution of optical power reduces the aberrations from the refractive surfaces and increases the diffractive efficiency of the diffractive surfaces by reducing the deflection angle required from each surface.

Further, a single refractive surface having a high numerical aperture would be difficult to incorporate on a wafer, since the increased curvature required for affecting such a refractive surface would result in very thin portions of a typical wafer, leading to concerns about fragility, or would require a thick wafer, which is not desirable in many applications where size is a major constraint. Further, the precise shape control required in the manufacture of a single refractive surface having high NA would present a significant challenge. Finally, the surfaces having the optical power distributed are easier to manufacture, have better reproducibility, and maintain a better quality wavefront.

In accordance with the present invention, more than one surface may be integrated with an active element such as a magnetic coil by bonding wafers together. Each wafer surface can have optics integrated thereon photolithographically, either directly or through molding or embossing. Each wafer contains an array of the same optical elements. When more than two surfaces are desired, wafers are bonded together. When the wafers are diced into individually apparatuses, the resulting product is called a die. The side views of FIGS. 2A, 3A, and 4A illustrate such dies which consist of two or three chips bonded together by a bonding material 25.

Figure 2B:
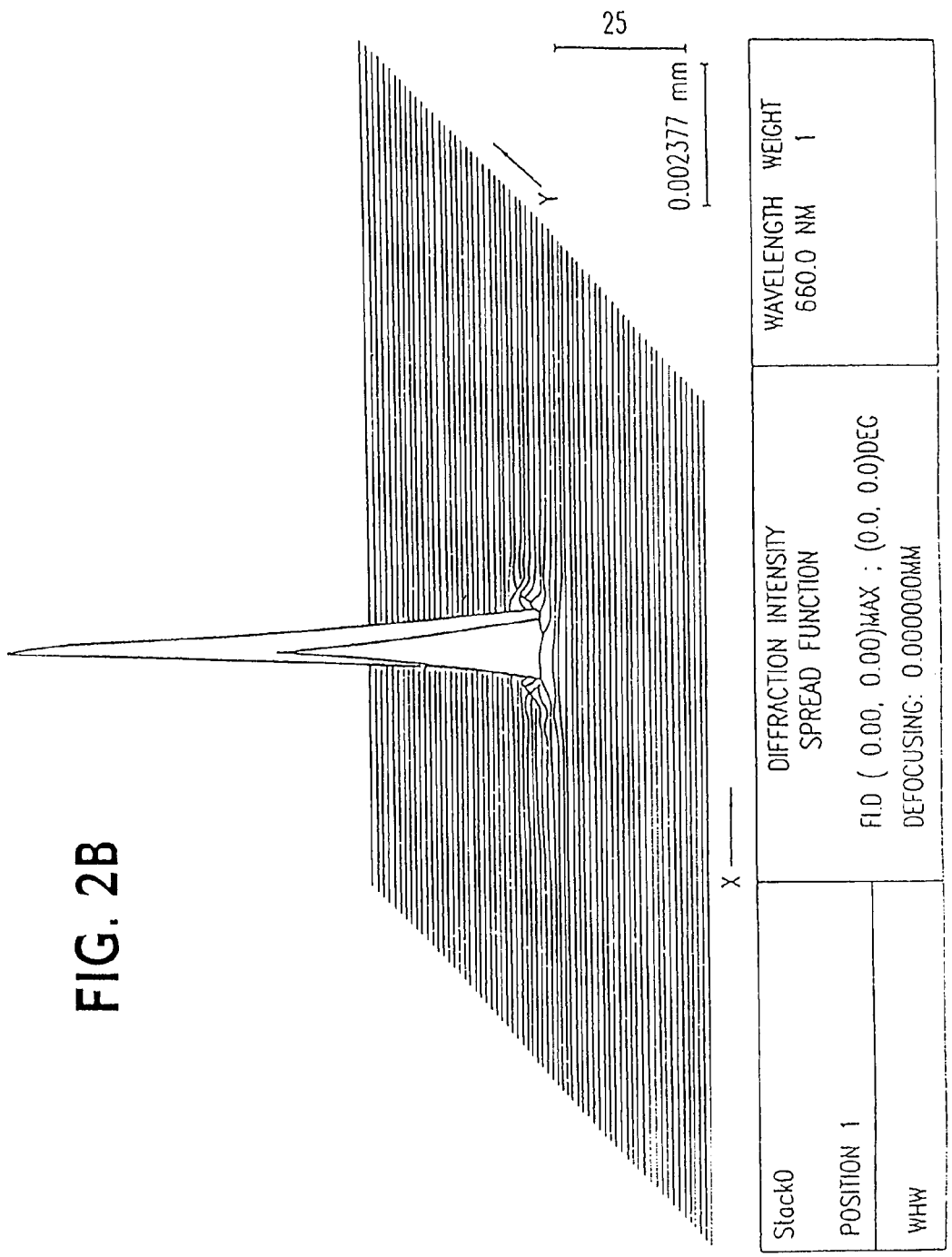
FIG. 2B illustrates the spread function of the optical system shown in FIG. 2A.

In the example shown in FIG. 2A, a diffractive surface 20 is followed by a refractive surface 22, which is followed by a diffractive surface 24, and then finally a refractive surface 26. In the example shown in FIG. 3A, a refractive surface 30 is followed by a diffractive surface 32, which is followed by a refractive surface 34 which is finally followed a diffractive surface 36. In the optical system shown in FIG. 4A, a refractive surface 40 is followed by a diffractive surface 42 which is followed by a refractive surface 44 which is followed by a diffractive surface 46, which is followed by a refractive surface 48 and finally a diffractive surface 50. The corresponding performance of each of these designs is shown in the corresponding intensity spread function of FIGS. 2B, 3B, and 4B.

Figure 3A:
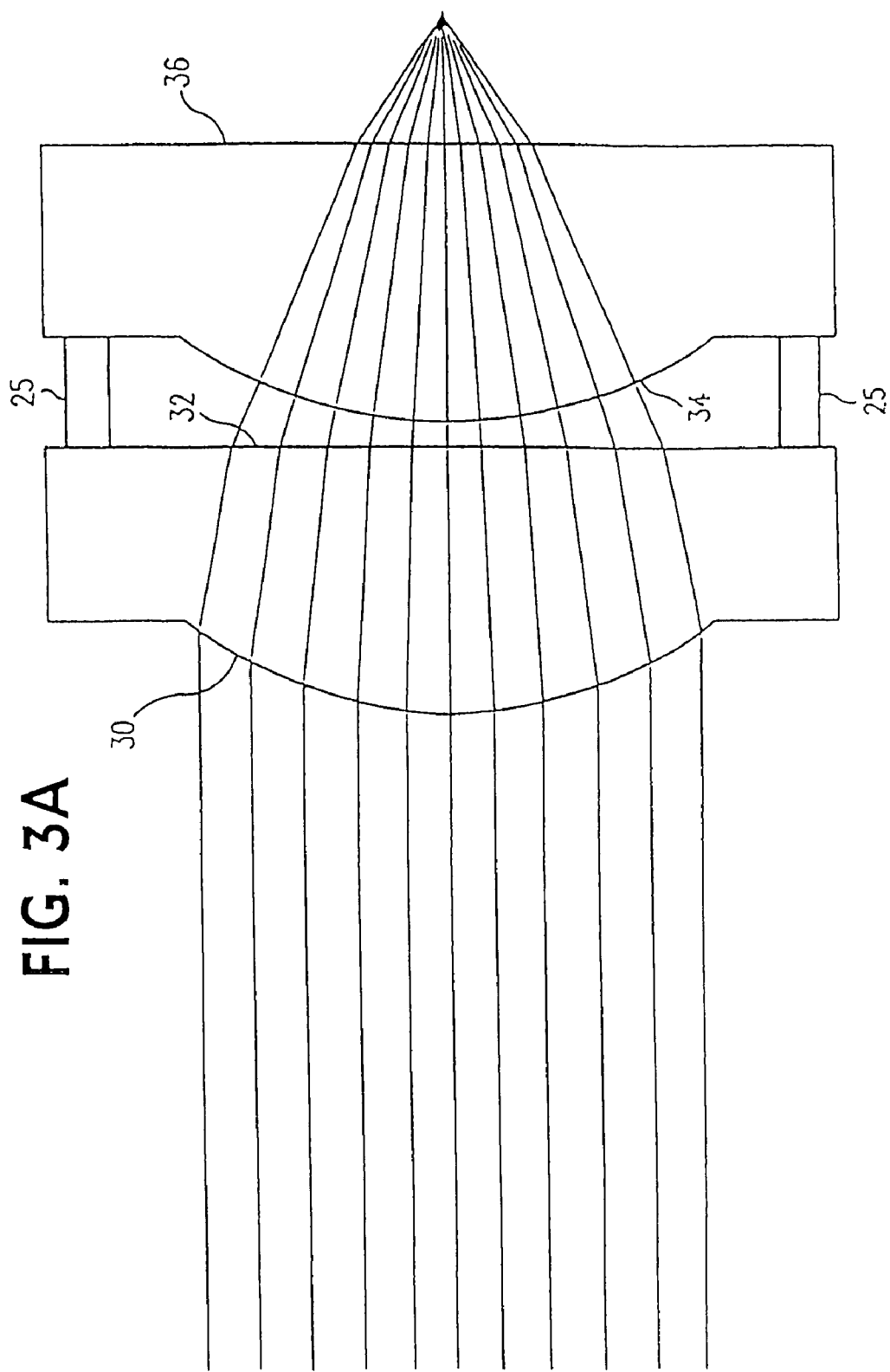
FIG. 3A illustrates a second embodiment of the optics for use in sliding block of the present invention.
Figure 3B:
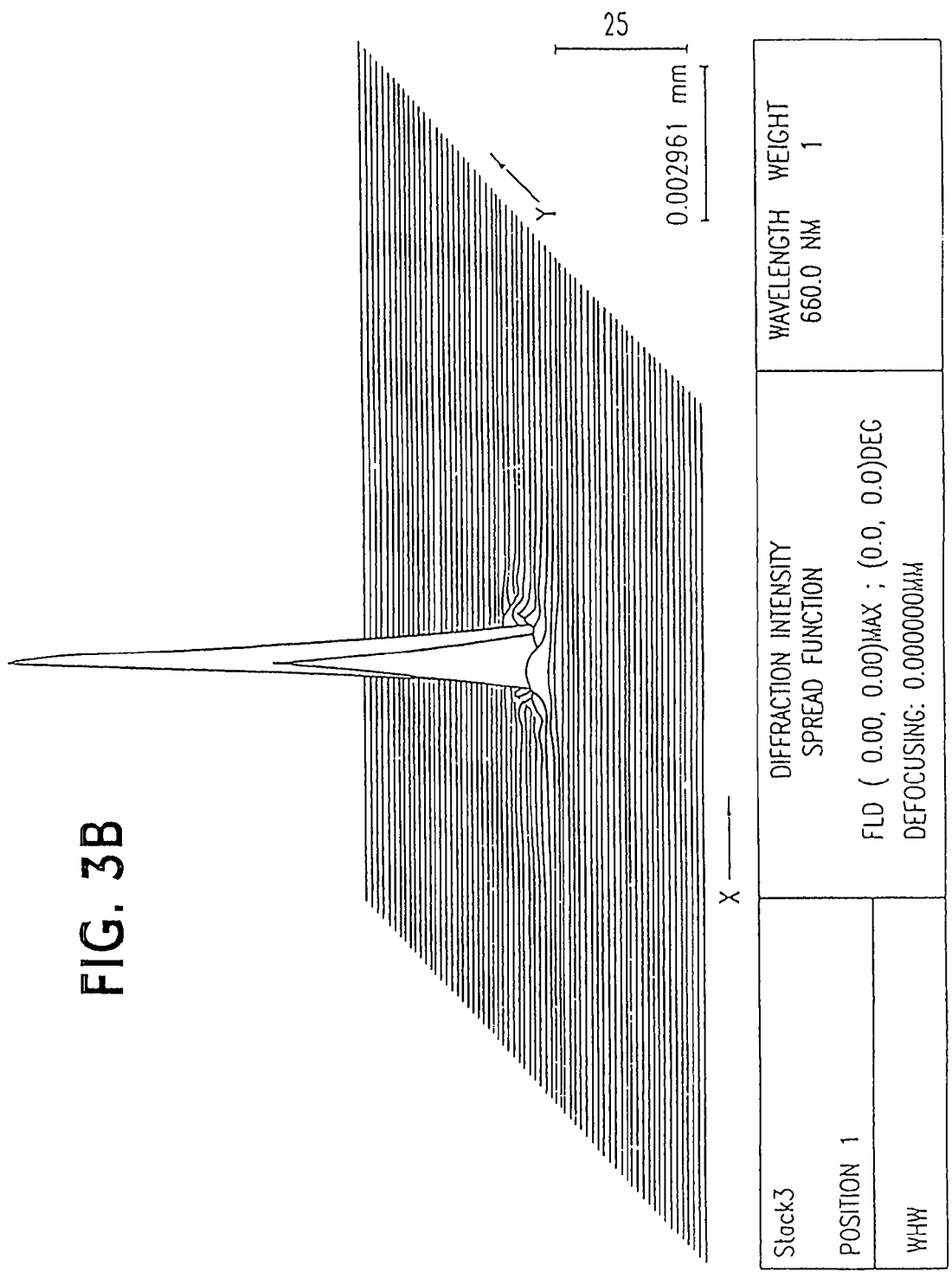
FIG. 3B illustrates the spread function of the optical system shown in FIG. 3A.
Figure 4B:
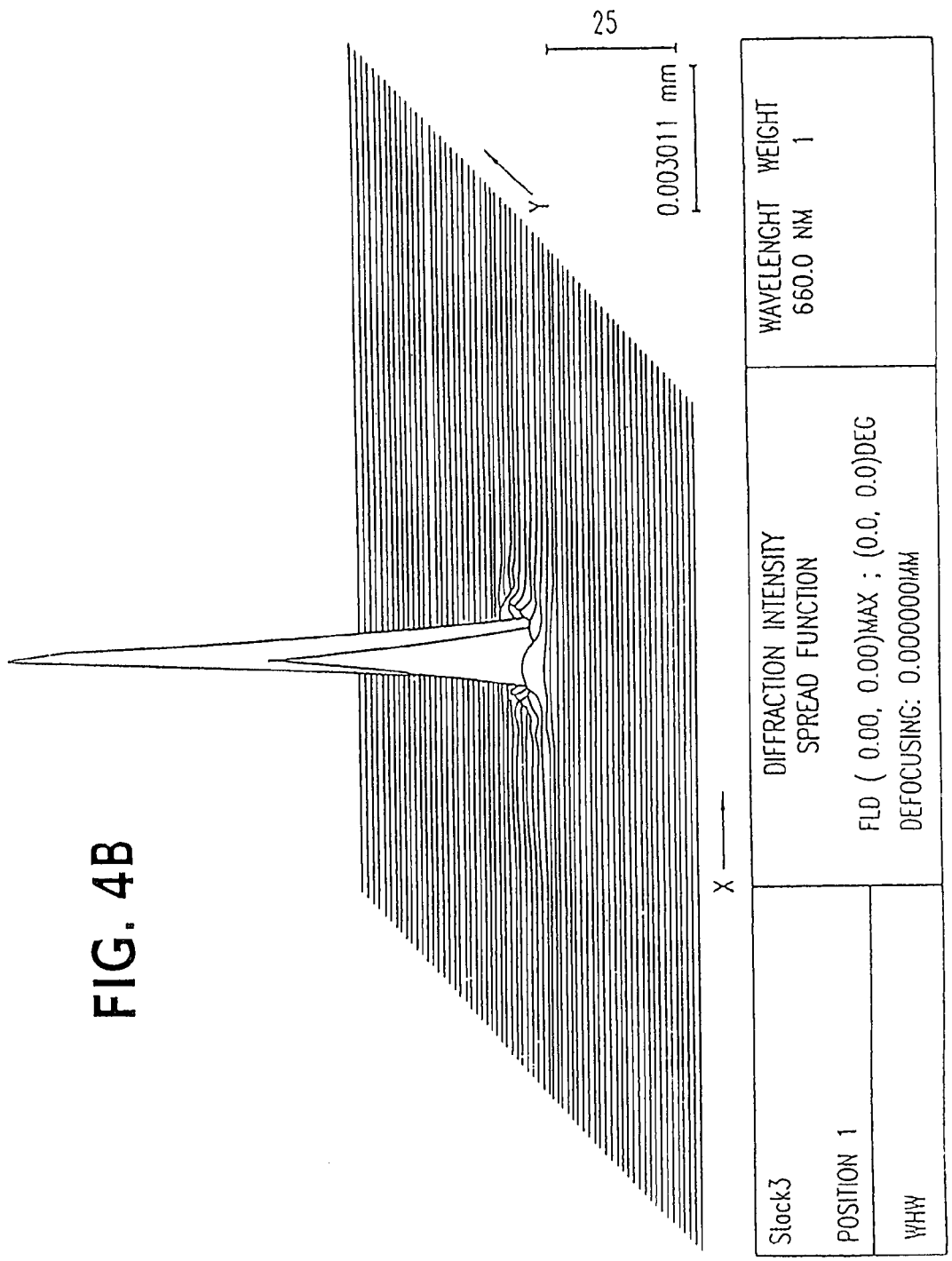
FIG. 4B illustrates the spread function of the optical system shown in FIG. 4A.

When using spherical refractive elements as shown in FIGS. 2A, 3A and 4A, it is convenient to follow these spherical refractive elements with a closely spaced diffractive element to compensate for the attendant spherical aberrations. An aspherical refractive does not exhibit such aberrations, so the alternating arrangement of refractives and diffractives will not necessarily be the preferred one.

While the optical elements may be formed using any technique, to achieve the required high numerical aperture, it is preferable that the refractive lenses remain in photoresist, rather than being transferred to the substrate. It is also preferable that the bottom substrate, i.e., the substrate closest to the media, has a high index of refraction relative of fused silica, for which n=1.36. Preferably, this index is at least 0.3 greater than that of the substrate. One example candidate material, SF56A, has a refractive index of 1.785. If the bottom substrate is in very close proximity to the media, e.g., less than 0.5 microns, the use of a high index substrate allows a smaller spot size to be realized. The numerical aperture N.A. is defined by the following:

$$N.A. = n \sin \theta$$

where n is the refractive index of the image space and $\theta$ is the half-angle of the maximum cone of light accepted by the lens. Thus, if the bottom substrate is in very close proximity to the media, the higher the index of refraction of the bottom substrate, the smaller the acceptance half-angle for the same performance. This reduction in angle increases the efficiency of the system.

Figure 5:
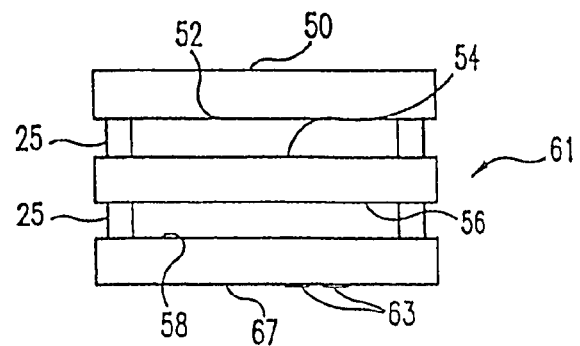
FIG. 5 is a side view of an embodiment of a slider block in accordance with the present invention.

As shown in FIG. 5, the slider block 61 in accordance with the present invention includes a die composed of a plurality of chips, each surface of which is available for imparting optical structures thereon. The die is formed from wafers having an array of respective optical elements formed thereon on either one or both surfaces thereof. The individual optical elements may be either diffractive, refractive or a hybrid thereof. Bonding material 25 is placed at strategic locations on either substrate in order to facilitate the attachment thereof. By surrounding the optical elements which are to form the final integrated die, the bonding material or adhesive 25 forms a seal between the wafers at these critical junctions. During dicing, the seal prevents dicing slurry from entering between the elements, which would result in contamination thereof. Since the elements remain bonded together, it is nearly impossible to remove any dicing slurry trapped there between. The dicing slurry presents even more problems when diffractive elements are being bonded, since the structures of diffractive elements tend to trap the slurry.

Advantageously, the wafers being bonded include fiducial marks somewhere thereon, most likely at an outer edge thereof, to ensure alignment of the wafers so that all the individual elements thereon are aligned simultaneously. Alternatively, the fiducial marks may be used to facilitate the alignment and creation of mechanical alignment features on the wafers. One or both of the fiducial marks and the alignment features may be used to align the wafers. The fiducial marks and/or alignment features are also useful in registering and placing the active elements and any attendant structure, e.g., a metallic coil and contact pads therefore, on a bottom surface. These active elements could be integrated either before or after dicing the wafers.

On a bottom surface 67 of the slider block 61 in accordance with the present invention, a magnetic head 63 including thin film conductors and/or a magnetic coil is integrated using thin film techniques, as disclosed, for example, in U.S. Pat. No. 5,314,596 to Shukovsky et al. entitled "A Process for Fabricating Magnetic Film Recording Head for use with a Magnetic Recording Media." The required contact pads for the magnetic coil are also preferably provided on this bottom surface.

Since the magnetic coil 63 is integrated on the bottom surface 67, and the light beam is to pass through the center of the magnetic coil, it is typically not practical to also provide optical structures on this bottom surface. This leaves the remaining five surfaces 50-58 available for modification in designing an optical system. Further, additional wafers also may be provided thereby providing a total of seven surfaces. With the examples shown in FIGS. 2A and 3A the surface 50 would correspond to surface 20 or 40, respectively, the surface 52 would correspond to surface 22 or 32, respectively, the surface 54 would correspond to surface 24 or 34, respectively, and the surface 56 would correspond to surface 26 or 36, respectively.

Each of these wafer levels can be made very thin, for example, on the order of 125 microns, so up to four wafers could be used even under the most constrained conditions. If size and heat limitations permit, a light source could be integrated on the top of the slider block, rather than using the fiber for delivery of light thereto. In addition to being thin, the use of the wafer scale assembly allows accurate alignment of numerous objects, thereby increasing the number of surfaces containing optical power, which can be used. This wafer scale assembly also allows use of passive alignment techniques. The other dimensions of the slider block 61 are determined by the size of the pads for the magnetic coil, which is typically 1500 microns, on the surface 67, which is going to be much larger than any of the optics on the remaining surfaces, and any size needed for stability of the slider block 61. The bottom surface 67 may also include etch features thereon which facilitate the sliding of the slider block 61.

Many configurations of optical surfaces may be incorporated into the slider block 61. The bonding, processing, and passive alignment of wafers is disclosed in co-pending, commonly assigned U.S. application Ser. No. 08/727,837 entitled "An Integrated Optical Head for Disk Drives and Method of Forming Same" and U.S. Pat. No. 6,096,155 entitled "A Wafer Level Integration of Multiple Optical Heads" which are both hereby incorporated by reference in their entirety.

Figure 6:
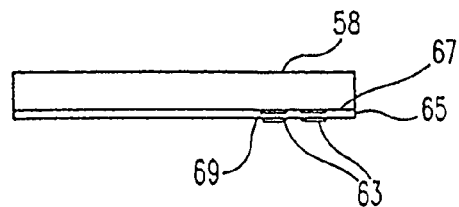
FIG. 6 is a side view of another embodiment of a slider block in accordance with the present invention.

Additionally, an optical element can be provided on the bottom surface 67 of the bottom wafer as shown in FIG. 6. When providing an optical element on this bottom surface 67, a transparent layer 65, having a different refractive index than that of the wafer itself is provided between the bottom surface 67 and the coil 63. The difference in refractive index between the layer 65 and the wafer should be at least approximately 0.3 in order to insure that the optical effect of the optical element provided on the bottom surface 67 is discernable. Also as shown in FIG. 6, a single wafer may be used if sufficient performance can be obtained from one or two optical elements.

Further as shown in FIG. 6, metal portions 69 may be provided to serve as an aperture for the system. These apertures may be integrated on any of the wafer surfaces. The aperture may also serve as the aperture stop, typically somewhere in the optical system prior to the bottom surface thereof. When such metal portions 69 serving as an aperture are provided on the bottom surface 67, it is advantageous to insure the metal portions 69 do not interfere with the operation of the metal coil 63.

A problem that arises when using a system with a high numerical aperture for a very precise application is that the depth of focus of the system is very small. Therefore, the distance from the optical system to the media must be very precisely controlled to insure that the beam is focused at the appropriate position of the media. For the high numerical apertures noted above, the depth of focus is approximately 1 micron or less. The thicknesses of the wafers can be controlled to within approximately 1-5 microns, depending on the thickness and diameter of the wafer. The thinner and smaller the wafer, the better the control. When multiple wafers are used, the system is less sensitive to a variation from a design thickness for a particular wafer, since the power is distributed through all the elements.

When using multiple wafers, the actual thickness of each wafer can be measured and the spacing between the wafers can be adjusted to account for any deviation. The position of the fiber or source location can be adjusted to correct for thickness variations within the wafer assembly. Alternatively, the design of a diffractive element may be altered in accordance with a measured thickness of the slider block in order to compensate for a variation from the desired thickness. Alternatively, the entire system may be designed to focus the light at a position deeper than the desired position assuming the thicknesses are precisely realized. Then, the layer 65 may be deposited to provide the remaining required thickness to deliver the spot at the desired position. The deposition of the layer 65 may be more precisely controlled than the formation of the wafers, and may be varied to account for any thickness variation within the system itself, i.e., the layer 65 does not have to be of uniform thickness. If no optical element is provided on the bottom surface 67, then the refractive index of the layer 65 does not need to be different from that of the wafer.

Figure 7:
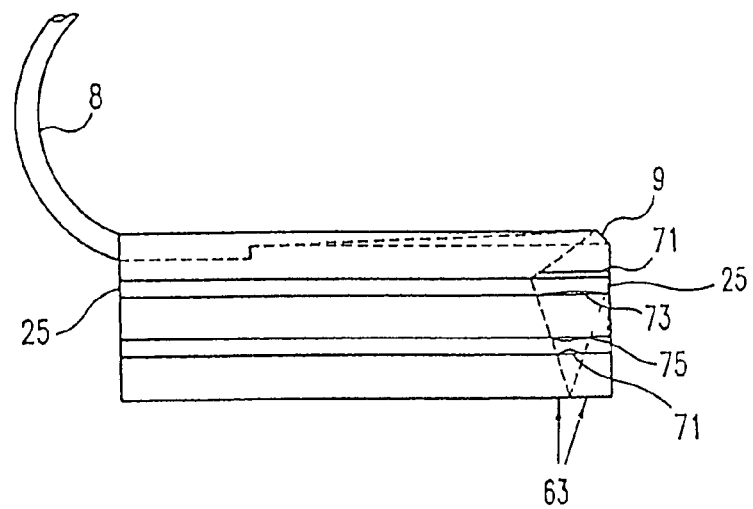
FIG. 7 is a side view of another embodiment of a slider block in accordance with the present invention.

FIG. 7 is a side view of another embodiment of the slider block. As shown in FIG. 7, the fiber 8 is inserted into the top wafer and the mirror 9 is integrated into the top wafer, preferably at a 45-degree angle. Light reflected by the mirror 9 is directed to a diffractive element 71, followed by a refractive element 73, followed by a diffractive element 75, followed by a refractive element 77, and delivered through the coil 63. For such a configuration, the top surface 50 is no longer available for providing an optical element.

Additionally, for fine scanning control of the light, the mirror 9 may be replaced with a micro-electro-mechanical system (MEMS) mirror mounted on a substrate on top of the top chip. A tilt angle of the MEMS is controlled by application of a voltage on a surface on which the reflector is mounted, and is varied in accordance with the desired scanning. The default position will preferably be 45 degrees so the configuration will be the same as providing the mirror 9.

Figure 8A:
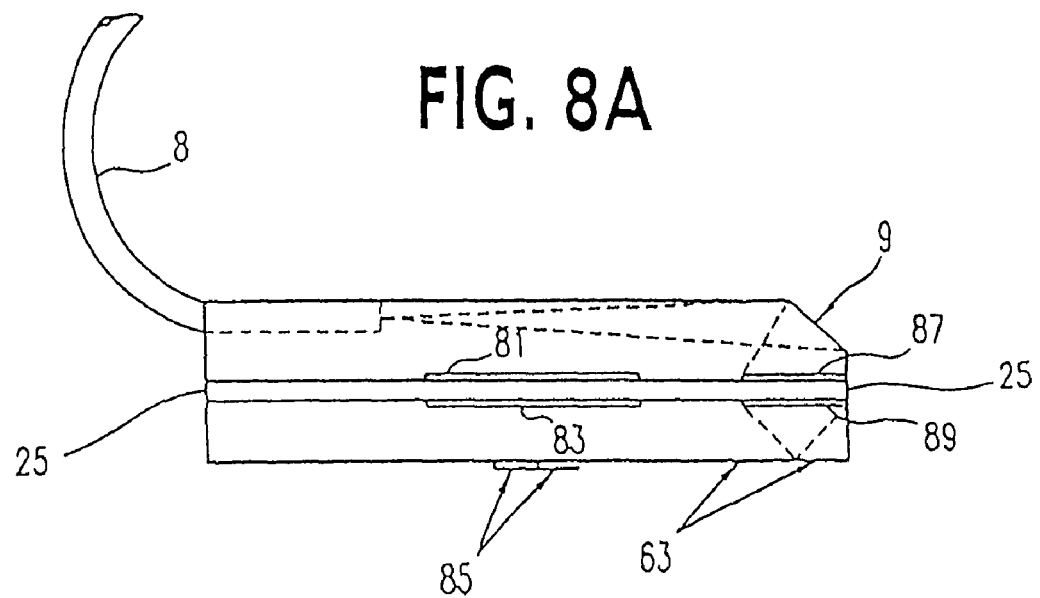
FIG. 8A is a side view of another embodiment of a slider block in accordance with the present invention.
Figure 8B:
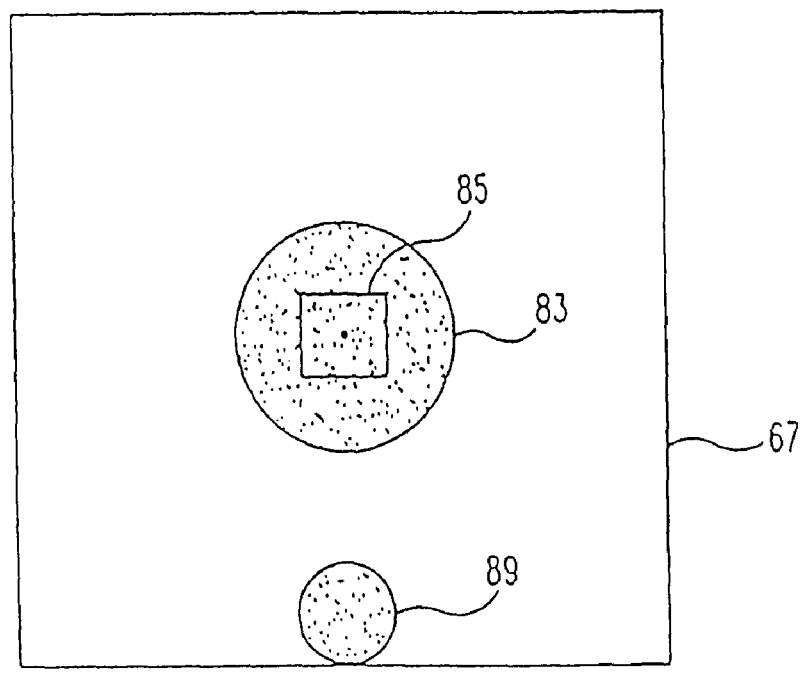
FIG. 8B is a bottom view of the embodiment in FIG. 8A.

An additional feature for monitoring the spot of light output from the slider block is shown in FIGS. 8A and 8B. As shown in FIG. 8A, in addition to the optical system, consisting of, for example, diffractive elements 87, 89, used for delivering light through the magnetic coil 63, monitoring optical elements 81, 83 are provided. The monitoring optical elements 81, 83 are of the same design as the elements of the optical system 87, 89, respectively. In other words, the monitoring optical elements are designed to focus at a same distance as that of the optical system. Advantageously, the monitoring optical elements 81, 83 are larger than the optical system elements for ease of construction and alignment of the test beam. In the configuration shown in FIGS. 8A and 8B, the monitoring optical elements 81, 83 are approximately twice the size of the element 87, 89. The monitoring system also includes an aperture 85, preferably formed by metal. It is noted that FIG. 8B does not show the magnetic coil 63.

During testing, light is directed to the monitoring optical system to insure that light is being delivered to the aperture at the desired location. The magnitude of light passing through the aperture will indicate if the optical system is sufficiently accurate, i.e., that the light is sufficiently focused at the aperture to allow a predetermined amount of light through. If the light is not sufficiently focused, the aperture will block too much of the light.

Thus, by using the monitoring system shown in FIGS. 8A and 8B, the optical system of the slider block may be tested prior to its insertion into the remaining device, even after being integrated with the active element 63. The dimension requirement imposed by the contact pads for the magnetic coil 63 and the coil itself result in sufficient room available on the wafers for the inclusion of such a monitoring system, so the size of the slider block is unaffected by the incorporation of the monitoring system.

Figure 10:
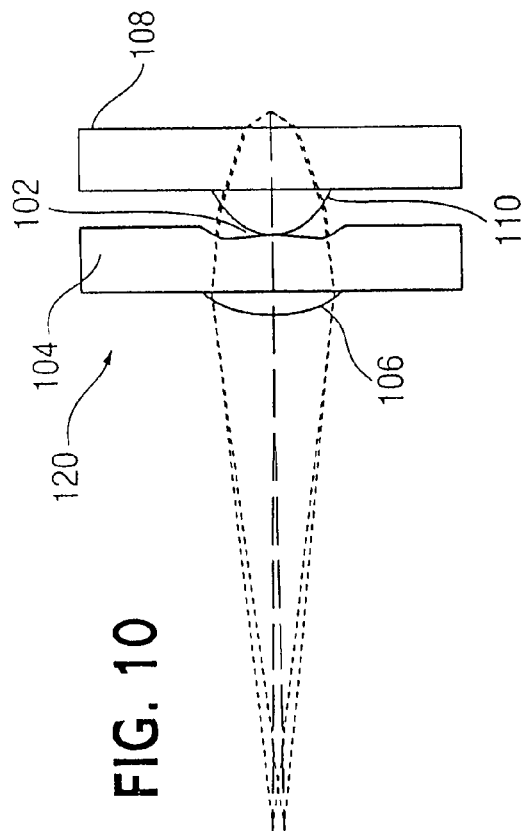
FIG. 10 is a cross-sectional view of an integrated micro-optical system of the present invention made in accordance with the process shown in FIG. 9.
Figure 12:
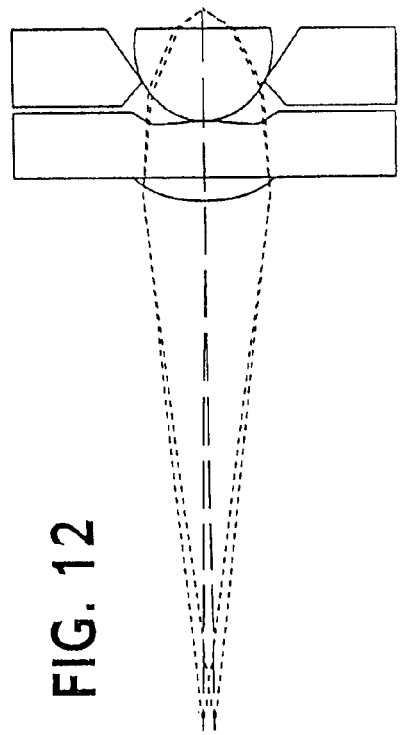
FIG. 12 is a cross-sectional view of an integrated micro-optical system of the present invention made in accordance with the process shown in FIG. 11.
Figure 9:
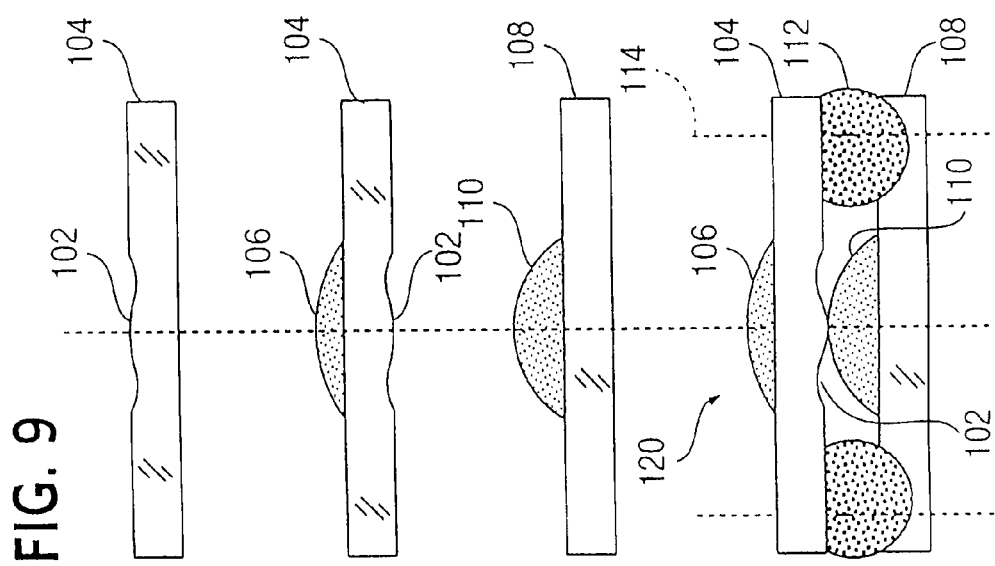
FIG. 9 is a cross-section view of an assembly process for manufacturing an integrated micro-optical system of the present invention.
Figure 11:
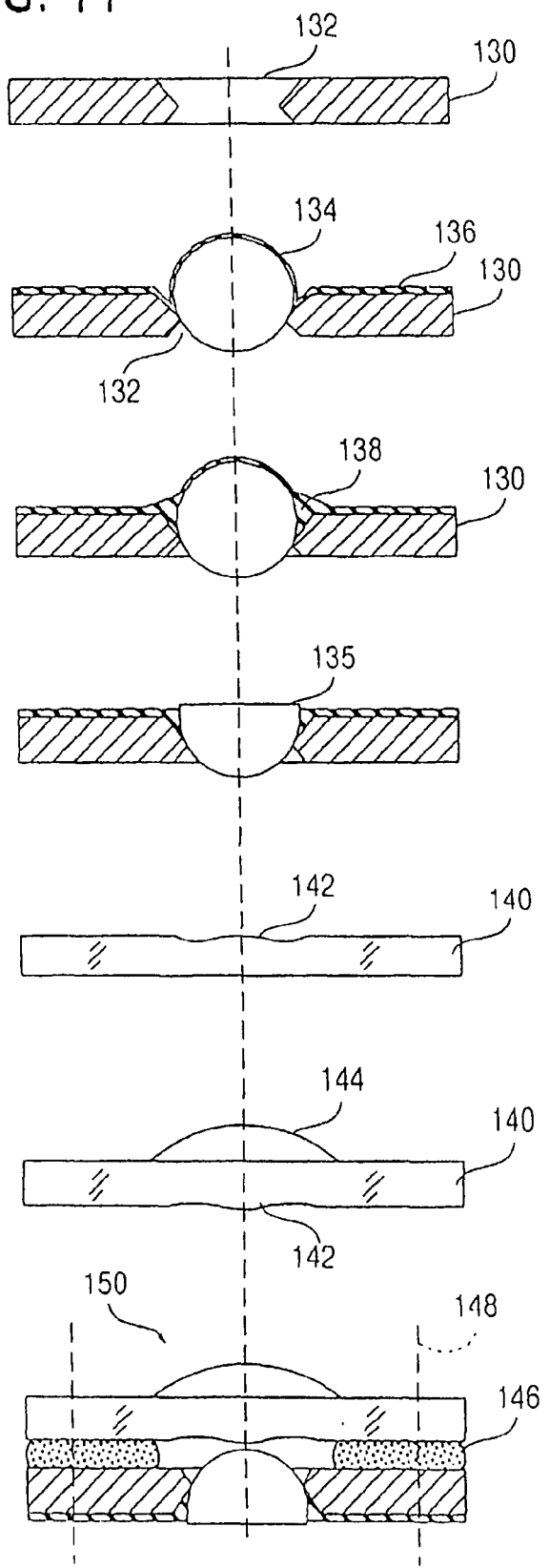
FIG. 11 is a cross-sectional view of an assembly process for manufacturing an integrated micro-optical system according to another embodiment of the present invention.

FIGS. 9 and 11 illustrate basic process steps for forming an integrated micro-optical system, with FIGS. 10 and 12 illustrating the system formed thereby, respectively.

In FIG. 9, only the basic fabrication process is illustrated, with anti-reflective coatings, intermediate lithography steps and adhesive deposition being omitted for clarity. Multi-layer lithography and etching is used to fabricate a shallow aspheric element 102 in a substrate 104, e.g., synthetic fused silica. Then, front-back alignment is used to provided photoresist on the substrate 104 opposite the shallow aspheric element 102. This photoresist is reflowed to form a refractive lens 106. On another substrate 108, illustratively a high index substrate glass that has been polished to a precise thickness tolerance, photoresist is provided and reflowed to form another refractive lens 110.

The substrates 104, 108 are then bonded together using a bonding material 112, illustratively an ultraviolet curable adhesive. As shown in FIG. 9, the refractive lens 110 is adjacent the shallow aspheric element 102. A resultant optical element 120 is preferably made on a wafer level, and the resultant optical element 120 is realized by dicing the wafer containing multiple resultant optical elements 120 along dicing lines 114. The shallow aspheric element 102 is optional and is provided to correct for aberrations introduced by the photoresist lens 106, 110. FIG. 10 schematically illustrates the functioning of the resultant optical element 120 formed by the process shown in FIG. 9.

A fabrication process used when including a high index ball lens is shown in FIG. 11. A wafer 130, e.g., a silicon wafer, is patterned and etched to from holes 132 therein. This hole 132 is to receive a high index ball lens 134. Illustratively, the ball lens 134 is secured in the hole 132 by applying a thin layer of wettable metal 136 over the entire surface. Then, solder 138 is plated over the surface. The wettable metal 136 provides surface tension which will pull the solder 138 into a binding region around the ball lens 134, securing the ball lens 134 in the hole 132. The wafer 130 is then polished to flatten a surface 135 of the ball lens 134. The use of a ball lens, while not allowing formation thereof on a wafer level, is advantageous in precise knowledge of the exact profile thereof and allows for a deeper sag to be realized.

Similarly as shown in FIG. 9, on another substrate 140, a multi-layer lithography and etching is used to fabricate a shallow aspheric element 142 in the substrate 140, e.g., synthetic fused silica. Then, front-back alignment is used to provided photoresist on the substrate 140 opposite the shallow aspheric element 142. This photoresist is reflowed to form a refractive lens 144.

The substrates 130, 140 are then bonded together using a bonding material 146, illustratively an ultraviolet curable adhesive. As shown in FIG. 11, the curved surface of the ball lens 134 is adjacent the shallow aspheric element 142. A resultant optical element 150 is preferably made on a wafer level, and the resultant optical element 150 is realized by dicing the wafer containing multiple resultant optical elements 150 along dicing lines 148. The shallow aspheric element 142 is optional and is provided to correct for aberrations introduced by the lenses 134, 144. FIG. 12 schematically illustrates the functioning of the resultant optical element 150 formed by the process shown in FIG. 11.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. An integrated micro-optical apparatus, comprising:
   an imaging system including first and second substrates, a first optical element on a first surface of the first substrate, and a second optical element on a second surface of the second substrate, the first and second surfaces being parallel and the first and second optical elements being substantially centered along an optical axis of the imaging system, wherein the first optical element is a refractive optical element having a different refractive index than a substrate supporting the first optical element; and
   an active element positioned in optical communication with the imaging system, wherein an imaging function of the imaging system is distributed over at least the first and second optical elements.

2. The integrated micro-optical apparatus as claimed in claim 1, wherein the first and second substrates are secured together at substantially planar regions.

3. The integrated micro-optical apparatus as claimed in claim 1, wherein the active element is on a bottom surface of the second substrate.

4. The integrated micro-optical apparatus as claimed in claim 1, further comprising a third substrate.

5. The integrated micro-optical apparatus as claimed in claim 4, further comprising a third optical element on the third substrate.

6. The integrated micro-optical apparatus as claimed in claim 5, wherein the imaging function is distributed over at least the first through third optical elements.

7. The integrated micro-optical apparatus as claimed in claim 5, wherein the active element is on a bottom surface of the third substrate.

8. The integrated micro-optical apparatus as claimed in claim 7, wherein the third optical element focuses light output from the first and second optical elements onto the active element.

9. The integrated micro-optical apparatus as claimed in claim 1, further comprising a third optical element on one of the first and second substrates, the third optical element being substantially centered along the optical axis of the imaging system.

10. The integrated micro-optical apparatus as claimed in claim 9, wherein the imaging function is distributed over at least the first through third optical elements.

11. The integrated micro-optical apparatus as claimed in claim 9, wherein the third optical element focuses light output from the first and second optical elements onto the active element.

12. The integrated micro-optical apparatus as claimed in claim 1, further comprising metal contacts on a bottom surface of the second substrate.

13. The integrated micro-optical apparatus as claimed in claim 1, further comprising a spacer between the first and second substrates.

14. The integrated micro-optical apparatus as claimed in claim 13, wherein a thickness of the spacer is determined in accordance with a difference between a desired thickness of one of the first and second substrates and a measured thickness of the one of the first and second substrates.

15. The integrated micro-optical apparatus as claimed in claim 1, wherein a numerical aperture of the imaging system is greater than the numerical aperture of either the first or second optical element.

16. The integrated micro-optical apparatus as claimed in claim 1, wherein a refractive index of the first optical element is higher than a refractive index of the substrate supporting the first optical element.

17. The integrated micro-optical apparatus as claimed in claim 1, wherein the first and second optical elements are on opposing sides of a single substrate.

18. The integrated micro-optical apparatus as claimed in claim 1, wherein at least one of the first and second optical elements is a molded optical element.

19. The integrated micro-optical apparatus as claimed in claim 1, wherein at least one of the first and second optical elements is an embossed optical element.

20. The integrated micro-optical apparatus as claimed in claim 1, wherein at least one of the first and second optical elements is a direct lithograph.

21. The integrated micro-optical apparatus as claimed in claim 1, wherein the integrated micro-optical apparatus is an optical head.

22. The integrated micro-optical apparatus as claimed in claim 1, further comprising a spacer between the first and second substrates.

23. The integrated micro-optical apparatus as claimed in claim 22, wherein a thickness of the spacer is determined in accordance with a difference between a desired thickness of one of the first and second substrates and a measured thickness of the one of the first and second substrates.

24. The integrated micro-optical apparatus as claimed in claim 1, wherein the integrated micro-optical apparatus is an optical head.

25. An integrated micro-optical apparatus, comprising:
an imaging system including first and second substrates, a first optical element on a first surface of the first substrate, and a second optical element on a second surface of the second substrate, the first and second surfaces being parallel and the first and second optical elements being substantially centered along an optical axis of the imaging system; and
an active element positioned in optical communication with the imaging system, wherein a numerical aperture of the imaging system is greater than the numerical aperture of either the first or second optical element.

26. The integrated micro-optical apparatus as claimed in claim 25, further comprising a third substrate having a third optical element on the third substrate.

27. The integrated micro-optical apparatus as claimed in claim 26, wherein the imaging function is distributed over at least the first through third optical elements.

28. The integrated micro-optical apparatus as claimed in claim 26, wherein the active element is on a bottom surface of the third substrate.

29. The integrated micro-optical apparatus as claimed in claim 28, wherein the third optical element focuses light output from the first and second optical elements onto the active element.

30. The integrated micro-optical apparatus as claimed in claim 25, further comprising a third optical element on one of the first and second substrates, the third optical element being substantially centered along the optical axis of the imaging system.

31. The integrated micro-optical apparatus as claimed in claim 30, wherein the imaging function is distributed over at least the first through third optical elements.

32. The integrated micro-optical apparatus as claimed in claim 30, wherein the third optical element focuses light output from the first and second optical elements onto the active element.

33. The integrated micro-optical apparatus as claimed in claim 25, further comprising metal contacts on a bottom surface of the second substrate.

34. The integrated micro-optical apparatus as claimed in claim 25, wherein the first and second optical elements are on opposing sides of a single substrate.

* * * * *